(12) United States Patent
Kim

(10) Patent No.: US 10,608,199 B2
(45) Date of Patent: Mar. 31, 2020

(54) DISPLAY APPARATUS

(71) Applicant: LG Display Co., Ltd., Seoul (KR)

(72) Inventor: Tae-Kyung Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/216,664

(22) Filed: Dec. 11, 2018

(65) Prior Publication Data

US 2019/0181373 A1    Jun. 13, 2019

(30) Foreign Application Priority Data

Dec. 13, 2017  (KR) .................... 10-2017-0171066

(51) Int. Cl.
| | |
|---|---|
| *H01L 51/52* | (2006.01) |
| *H01L 27/32* | (2006.01) |
| *H01L 51/50* | (2006.01) |
| *G09G 3/3291* | (2016.01) |

(52) U.S. Cl.
CPC ....... *H01L 51/5221* (2013.01); *G09G 3/3291* (2013.01); *H01L 27/3246* (2013.01); *H01L 27/3276* (2013.01); *H01L 51/5012* (2013.01); *H01L 51/5206* (2013.01); *H01L 51/5225* (2013.01); *H01L 51/5256* (2013.01); *G09G 2310/08* (2013.01)

(58) Field of Classification Search
CPC . H01L 51/52; H01L 51/5221; H01L 51/5256; H01L 27/32; H01L 27/3246; H01L 27/3276
USPC .......................................................... 257/40
See application file for complete search history.

(56) References Cited

U.S. PATENT DOCUMENTS

| | | | |
|---|---|---|---|
| 2011/0121299 A1 | 5/2011 | Kim et al. | |
| 2015/0044797 A1* | 2/2015 | Park .................... | H01L 27/1259 438/30 |
| 2016/0126498 A1* | 5/2016 | Kim .................... | H01L 51/5253 257/40 |
| 2016/0133874 A1* | 5/2016 | Kim .................... | H01L 51/5259 257/40 |
| 2017/0179092 A1 | 6/2017 | Sasaki et al. | |
| 2017/0186824 A1 | 6/2017 | Lee et al. | |
| 2017/0279079 A1 | 9/2017 | Kim et al. | |
| 2017/0287938 A1 | 10/2017 | Lee et al. | |

FOREIGN PATENT DOCUMENTS

| | | |
|---|---|---|
| KR | 10-2009-0068505 A | 6/2009 |
| TW | 201018308 A | 5/2010 |
| TW | 201119029 A | 6/2011 |
| TW | 201735417 A | 10/2017 |
| TW | 201740561 A | 11/2017 |

OTHER PUBLICATIONS

Taiwan Intellectual Property Office, Office Action, TW Patent Application No. 107144756, dated Jun. 28, 2019, 14 pages.

* cited by examiner

*Primary Examiner* — Fazli Erdem

(74) *Attorney, Agent, or Firm* — Fenwick & West LLP

(57) ABSTRACT

A display apparatus in which a cathode electrode disposed in a display area is prevented from being oxidized. The display apparatus includes a substrate including a display area and a non-display area surrounding the display area, a first electrode formed on the substrate, an organic light emitting layer formed on the first electrode, and a second electrode formed on the organic light emitting layer and including at least one first opening area.

24 Claims, 9 Drawing Sheets

DISPLAY APPARATUS

CROSS-REFERENCE TO RELATED APPLICATIONS

This application claims priority to Republic of Korea Patent Application No. 10-2017-0171066 filed on Dec. 13, 2017, which is hereby incorporated by reference in its entirety.

BACKGROUND

Field of the Technology

The present disclosure relates to a display apparatus.

Discussion of the Related Art

As an information society has developed, there has been a growing demand for display apparatuses for displaying images. In recent years, various display apparatuses such as a liquid crystal display (LCD), a plasma display panel (PDP), and an organic light emitting display (OLED) have been used.

The organic light emitting display, among the displays, is self-luminous, has a wider viewing angle and better contrast ratio than the liquid crystal display (LCD), is light and thin without the necessity of a separate backlight, and is advantageous in terms of power consumption. Further, the organic light emitting display may be driven with a low DC voltage, has a high response speed, and, in particular, incurs low manufacturing cost.

An organic light emitting display includes pixels each including an organic light emitting element and a bank partitioning the pixels to define the pixels. The bank may serve as a pixel defining layer. The organic light emitting element includes an anode electrode, a hole transporting layer, an organic light emitting layer, an electron transporting layer, and a cathode electrode. In this case, when a high potential voltage is applied to the anode electrode and a low potential voltage is applied to the cathode electrode, holes and electrons move to the organic light emitting layer through the hole transporting layer and the electron transporting layer, respectively, and combine in the organic light emitting layer to emit light.

The organic light emitting element has a disadvantage that deterioration easily occurs due to external factors such as ambient moisture and oxygen. In particular, the cathode electrode may be oxidized by reacting with moisture. The cathode electrode of the organic light emitting element is in general formed as one electrode having an area larger than a display area. When moisture penetrates into a portion of the cathode electrode, oxidation may proceed throughout the cathode electrode.

Recently, a narrow bezel is desired. As the bezel is narrowed, moisture penetration occurs more frequently in the cathode electrode and oxidation may proceed more quickly in the light emitting region. As a result, the organic light emitting element may not emit light.

SUMMARY

Accordingly, the present disclosure is directed to providing a display apparatus that substantially obviates one or more problems due to limitations and disadvantages of the related art.

An aspect of the present disclosure is directed to providing a display apparatus in which a cathode electrode disposed in a display area is prevented from being oxidized.

An embodiment of the present disclosure relates to a display apparatus including a substrate having a display area where light is emitted and a non-display area where no light is emitted, the non-display area surrounding the display area, a first electrode on the substrate, an organic light emitting layer on the first electrode, and a second electrode on the organic light emitting layer. The second electrode includes at least one opening area in the non-display area of the substrate.

An embodiment of the present disclosure relates to a display apparatus including a substrate having a display area where light is emitted and a non-display area where light is not emitted, a first electrode in the display area of the substrate, an organic light emitting layer overlapping the first electrode in the display area of the substrate, and a second electrode in both the display area and the non-display area of the substrate. The second electrode overlaps the organic light emitting layer in the display area, and the second electrode includes a first opening area and a second opening area. The first opening area is in a first portion of the second electrode that is in the non-display area of the substrate, and the second opening area is parallel to the first opening area and is in a second portion of the second electrode that is in the non-display area of the substrate.

Additional advantages and features of the disclosure will be set forth in portion in the description which follows and in portion will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area and a non-display area surrounding the display area, a first electrode formed on the substrate, an organic light emitting layer formed on the first electrode, and a second electrode formed on the organic light emitting layer and including at least one first opening area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a portion of this application, illustrate embodiments of the disclosure and together with the description serve to explain the principle of the disclosure.

DETAILED DESCRIPTION OF THE DISCLOSURE

Figure 1:
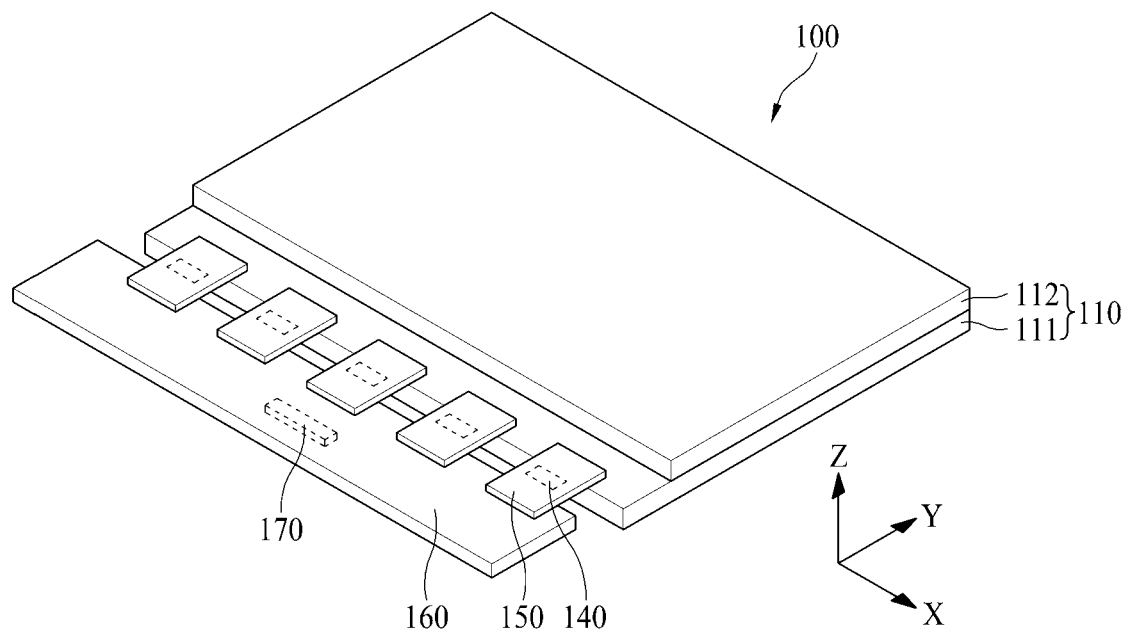
FIG. 1 is a perspective view illustrating a display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~%', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
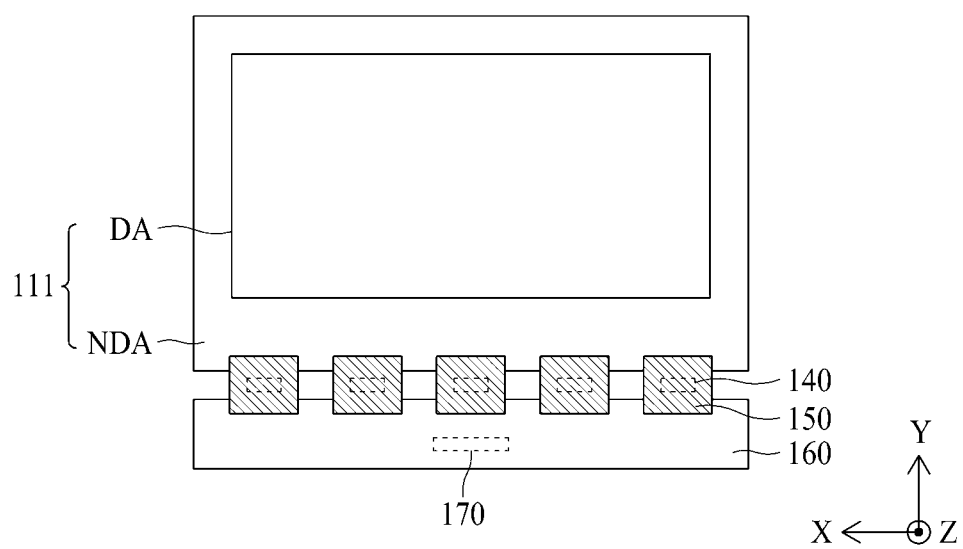
FIG. 2 is a plan view illustrating a first substrate, a source drive IC, a flexible film, a circuit board, and a timing controller of FIG. 1.

FIG. 1 is a perspective view illustrating a display apparatus according to an embodiment of the present disclosure. FIG. 2 is a plan view illustrating a first substrate, a source drive IC, a flexible film, a circuit board, and a timing controller of FIG. 1.

Hereinafter, a display apparatus according to an embodiment of the present disclosure is described as an organic light emitting display apparatus. However, the present disclosure is not limited thereto. That is, the display apparatus according to an embodiment of the present disclosure may be implemented as any one of a liquid crystal display, a field emission display, a quantum dot lighting emitting diode, and an electrophoresis display, as well as the organic light emitting display apparatus.

Referring to FIGS. 1 and 2, a display apparatus 100 according to an embodiment of the present disclosure includes a display panel 110, a source drive integrated circuit (IC) 140, a flexible film 150, a circuit board 160, and a timing controller 170.

The display panel 110 includes a first substrate 111 and a second substrate 112. The second substrate 112 may be an encapsulating substrate. The first substrate 111 may be a plastic film or a glass substrate. The second substrate 112 may be a plastic film, a glass substrate, or an encapsulation layer.

Gate lines, data lines, and pixels are formed on one surface of the first substrate 111 facing the second substrate 112. The pixels are provided in regions defined by an intersection structure of the gate lines and the data lines.

Each of the pixels may include an organic light emitting element including a thin film transistor (TFT), a first electrode, an organic light emitting layer, and a second electrode. Each of the pixels supplies a predetermined current to the organic light emitting element in accordance with a data voltage of a data line when a gate signal is input from a gate line using the TFT. Thus, the organic light emitting element of each of the pixels may emit light with predetermined brightness according to the predetermined current. The structure of each of the pixels will be described later with reference to FIG. 4.

The display panel 110 may be divided into a display area DA in which the pixels are formed to display an image and a non-display area NDA which does not display an image. Gate lines, data lines, and pixels may be formed in the display area DA. A gate driving unit and pads may be formed in the non-display area NDA.

The gate driving unit supplies gate signals to gate lines according to a gate control signal input from the timing controller 170. The gate driving unit may be formed in the non-display area DA on one side or both sides of the display area DA of the display panel 110 in a gate driving unit in panel (GIP) manner. Alternatively, the gate driving unit may be formed of a driving chip and mounted on a flexible film, and may be adhered to the non-display area DA on one side or both sides of the display area DA of the display panel 110 in a tape automated bonding manner.

The source drive IC 140 receives digital video data and a source control signal from the timing controller 170. The source driver IC 140 converts the digital video data into an analog data voltage according to the source control signal and supplies the analog data voltage to the data lines. When the source drive IC 140 is manufactured as a driving chip, the source drive IC 140 may be mounted on the flexible film 150 in a chip on film (COF) manner or a chip on plastic (COP) manner.

In the non-display area NDA of the display panel 110, pads such as data pads may be formed. Lines connecting the pads and the source drive IC 140 and lines connecting the pads and lines of the circuit board 160 may be formed in the flexible film 150. The flexible film 150 may be adhered to the pads using an anisotropic conducting film, whereby the pads and the lines of the flexible film 150 may be connected.

The circuit board 160 may be adhered to the flexible films 150. A plurality of circuits implemented as driving chips may be mounted on the circuit board. For example, the timing controller 170 may be mounted on the circuit board 160. The circuit board 160 may be a printed circuit board or a flexible printed circuit board.

The timing controller 170 receives digital video data and a timing signal from an external system board through a cable of the circuit board 160. The timing controller 170 generates a gate control signal for controlling an operation timing of the gate driving unit and a source control signal for controlling the source drive ICs 140 on the basis of the timing signal. The timing controller 170 supplies a gate control signal to the gate driving unit and a source control signal to the source drive ICs 140.

First Embodiment

Figure 3:
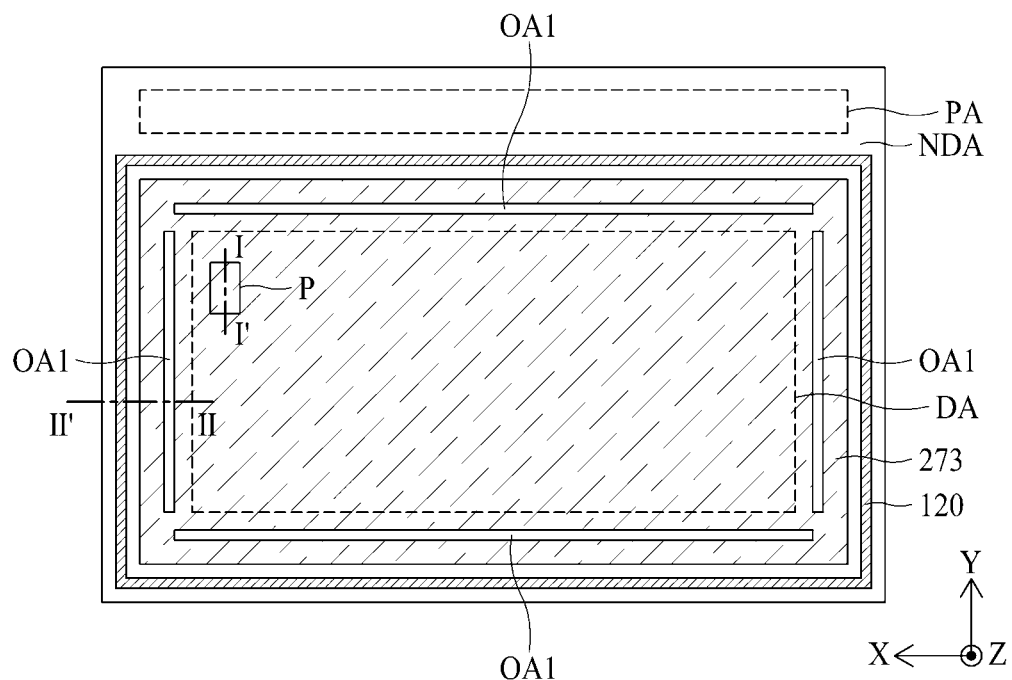
FIG. 3 is a plan view schematically illustrating a first substrate according to a first embodiment of the present disclosure.

FIG. 3 is a plan view schematically illustrating a first substrate according to a first embodiment of the present disclosure.

Referring to FIG. 3, a first substrate 111 is divided into a display area DA and a non-display area NDA, and a pad area PA in which pads are formed in the non-display area NDA.

In the display area DA, data lines and gate lines that intersect the data lines are formed. In addition, in the display area DA, pixels P for displaying an image are formed in a matrix form in the intersections of the data lines and the gate lines. In each of the pixels P, when a gate signal is input to a gate line, a predetermined current is supplied to a light emitting element according to a data voltage of the data line. Accordingly, the light emitting element of each of the pixels P may emit light with predetermined brightness according to the predetermined current. A power line is supplied with a power supply voltage. The power line supplies the power supply voltage to each of the pixels P.

Hereinafter, a structure of the pixel P of the display area DA according to the embodiments of the present disclosure will be described in detail with reference to FIG. 4.

Figure 4:
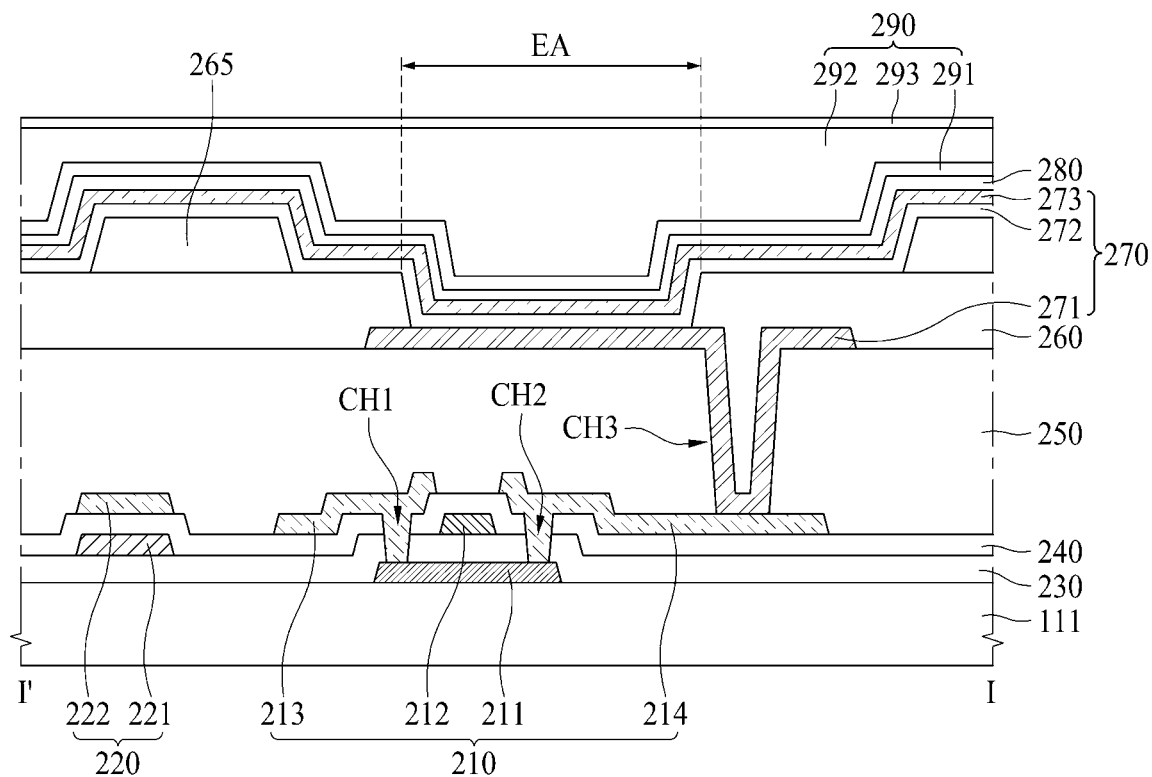
FIG. 4 is a cross-sectional view illustrating an example of a pixel in the display area of FIG. 3.

FIG. 4 is a cross-sectional view illustrating an example of a pixel in the display area of FIG. 3.

Referring to FIG. 4, thin film transistors (TFTs) 210 and capacitors 220 are formed on one surface of the first substrate 111 facing the second substrate 112.

A buffer layer may be formed on the first substrate 111 to protect the TFTs 210 from moisture penetrating through the first substrate 111 which is susceptible to moisture transmission.

Each of the TFTs 210 includes an active layer 211, a gate electrode 212, a source electrode 213, and a drain electrode 214. In FIG. 4, the TFTs 210 are formed according to a top gate scheme in which the gate electrode 212 of each of the TFTs 210 is formed above the active layer 211 is illustrated but it should be appreciated that the present disclosure is not limited thereto. That is, the TFTs 210 may be formed according to a bottom gate scheme in which the gate electrode 212 is located below the active layer 211 or according to a double gate scheme in which the gate electrode 212 is formed above and below the active layer 211.

An active layer 211 is formed on the buffer layer of the first substrate 110. The active layer 211 may be formed of a silicon-based semiconductor material or an oxide-based semiconductor material. A light blocking layer for blocking ambient light incident on the active layer 211 may be formed on the first substrate 110.

A gate insulating layer 230 may be formed on the active layer 211. The gate insulating layer 230 may be formed of an inorganic layer, e.g., a silicon oxide layer, a silicon nitride layer, or a multi-layer thereof.

The gate electrode 212 may be formed on the gate insulating layer 230. The gate electrode 212 may be a single layer or a multi-layer formed of any one of molybdenum (Mo), aluminum (Al), chromium (Cr), gold (Au), titanium (Ti), nickel (Ni), neodymium (Nd), and copper (Cu), or an alloy thereof but it is not limited thereto.

An interlayer insulating layer 240 may be formed on the gate electrode 212. The interlayer insulating layer 240 may be formed of an inorganic layer, e.g., a silicon oxide layer, a silicon nitride layer, or a multi-layer thereof.

A source electrode 213 and a drain electrode 214 may be formed on the interlayer insulating layer 240. The source electrode 213 and the drain electrode 214 may be connected to the active layer 211 through contact holes CH1 and CH2 penetrating through the gate insulating layer 230 and the interlayer insulating layer 240. Each of the source electrode 213 and the drain electrode 214 may be formed of a metal such as molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

Each of the capacitors 220 includes a lower electrode 221 and an upper electrode 222. The lower electrode 221 is formed on the gate insulating layer 230 and may be formed of the same material as that of the gate electrode 212. The upper electrode 222 may be formed on the interlayer insulating layer 240 and may be formed of the same material as that of the source electrode 213 and the drain electrode 214.

A passivation layer (not shown) may be formed on the TFT 210 and the capacitor 220. The passivation layer may serve as an insulating layer. The passivation layer may be formed of an inorganic layer, e.g., a silicon oxide layer, a silicon nitride layer, or a multi-layer thereof. The passivation layer may be omitted.

A planarization layer 250 may be formed on the passivation layer to smooth a step due to the TFT 210 and the capacitor 220. The planarization layer 250 may be formed of an organic layer such as an acrylic resin, an epoxy resin, a phenolic resin, a polyamide resin, or a polyimide resin.

An organic light emitting element 270, a bank 260, and a spacer 265 are formed on the planarization layer 250. The organic light emitting element 270 includes a second electrode 273, an organic light emitting layer 272, and a first electrode 271. The second electrode 273 may be a cathode electrode, and the first electrode 271 may be an anode electrode. A region where the second electrode 273, the organic light emitting layer 272, and the first electrode 271 are stacked may be defined as a light emitting portion EA.

The first electrode 271 may be formed on the planarization layer 250. The first electrode 271 is connected to the drain electrode 214 of the TFT 210 via a contact hole CH3 penetrating through the passivation layer and the planarization layer 250. The first electrode 271 may be formed of a metal having high reflectivity such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO).

The APC alloy is an alloy of silver (Ag), palladium (Pd), and copper (Cu).

The bank 260 may be formed to cover the edge of the first electrode 271 on the planarization layer 250 to partition the light emitting portions EA. The bank 260 may be formed of an organic layer such as an acrylic resin, an epoxy resin, a phenolic resin, a polyamide resin, or a polyimide resin.

The spacer 265 may be formed on the bank 260. The spacer 265 may be formed of an organic layer such as an acrylic resin, an epoxy resin, a phenolic resin, a polyamide resin, or a polyimide resin. The spacer 265 may be omitted.

An organic light emitting layer 272 is formed on the first electrode 271, the bank 260, and the spacer 265. The organic light emitting layer 272 may include a hole transporting layer, at least one light emitting layer, and an electron transporting layer. In this case, when a voltage is applied to the first electrode 271 and the second electrode 273, holes and electrons move to the light emitting layer through the hole transporting layer and the electron transporting layer, respectively, and are combined with each other in the light emitting layer to emit light.

The organic light emitting layer 272 may be a white light emitting layer that emits white light. In this case, the organic light emitting layer 272 may be formed to cover the first electrode 271 and the bank 260. In this case, a color filter (not shown) may be formed on the second substrate 112.

Alternatively, the organic light emitting layer 272 may include a red light emitting layer emitting red light, a green light emitting layer emitting green light, or a blue light emitting layer emitting blue light. In this case, the organic light emitting layer 272 may be formed in a region corresponding to the first electrode 271 and a color filter may not be formed on the second substrate 112.

The second electrode 273 is formed on the organic light emitting layer 272. In cases where the organic light emitting display apparatus is formed as a top emission type apparatus, the second electrode 273 may be formed of a transparent conductive material (TCO) such as ITO or IZO which allows light to be transmitted therethrough or a semi-transmissive conductive material such as magnesium (Mg), silver (Ag), or an alloy thereof.

A capping layer 280 is formed on the organic light emitting element 270. The capping layer 280 is formed on the second electrode 273 to protect the first electrode 271, the organic light emitting layer 272, and the second electrode 273. Also, the capping layer 280 allows light generated in the organic light emitting layer 272 to be efficiently emitted to the outside. The capping layer 280 is formed of at least one of an inorganic material and an organic material. The capping layer 280 may be formed of an inorganic layer or an organic layer or may be an organic layer containing inorganic particles.

The capping layer 280 may be formed of an inorganic layer such as zinc oxide, titanium oxide, zirconium oxide, niobium oxide, tantalum oxide, tin oxide, nickel oxide, silicon nitride, indium nitride, gallium nitride, and the like.

The capping layer 280 may be formed of poly(3,4-ethylenedioxythiophene) (PEDOT), 4,4'-bis[N-(3-methylphenyl)-N-phenyl amino)biphenyl (TPD), 4,4',4"-tris[(3-methylphenyl) phenyl amino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol] (TPBI), and 3-(4-biphenyl)-4-phenyl-5-t-butylphenyl-1,2,4-trizole (TAZ), or the like.

An encapsulation layer 290 is formed on the capping layer 280. The encapsulation layer 290 serves to prevent oxygen or moisture from penetrating into the organic light emitting layer 272 and the second electrode 273. To this end, the encapsulation layer 290 may include at least one inorganic layer and at least one organic layer.

For example, the encapsulation layer 290 may include a first inorganic layer 291, an organic layer 292, and a second inorganic layer 293. In this case, the first inorganic layer 291 is formed to cover the second electrode 273. An organic layer 292 is formed on the first inorganic layer 291. The organic layer 292 may have a thickness sufficient to prevent introduction of particles to the organic light emitting layer 272 and the second electrode 273 through the first inorganic layer 291. The second inorganic layer 293 is formed to cover the organic layer 292.

First to third color filters (not shown) and a black matrix (not shown) may be formed on the encapsulation layer 290. A red color filter may be formed in the red light emitting portion, a blue color filter may be formed in the blue light emitting portion, and a green color filter may be formed in the green light emitting portion.

The encapsulation layer 290 of the first substrate 111 and the color filters (not shown) of the second substrate 112 are adhered using an adhesive layer (not shown), and thus, the first substrate 111 and the second substrate 112 may be bonded together. The adhesive layer may be a transparent adhesive resin.

Referring back to FIG. 3, the pad area PA may be disposed at an edge on one side of the first substrate 111. More specifically, the first substrate 111 has a first side, a second side facing the first side, a third side connecting one end of the first side and one end of the second side, and a fourth side connecting the other end of the first side and the other end of the second side, and the pad area PA may be formed on the first side. The pad area PA may include a plurality of pads, and the plurality of pads may be electrically connected to lines of the flexible film 150 using an anisotropic conducting film.

The second electrode 273 of the organic light emitting element 270 is formed to have an area larger than the display area DA. The second electrode 273 is also formed in a portion of the non-display area NDA, as well as in the display area DA.

A dam 120 is disposed in the non-display area NDA and spaced apart from the second electrode 273 and blocks a flow of the organic layer 292 constituting the encapsulation layer 290 of the pixel P to prevent the organic layer 292 from flowing to the outside.

Hereinafter, the display apparatus according to the first embodiment of the present disclosure will be described in detail with reference to FIGS. 5 to 8 together.

Figure 5:
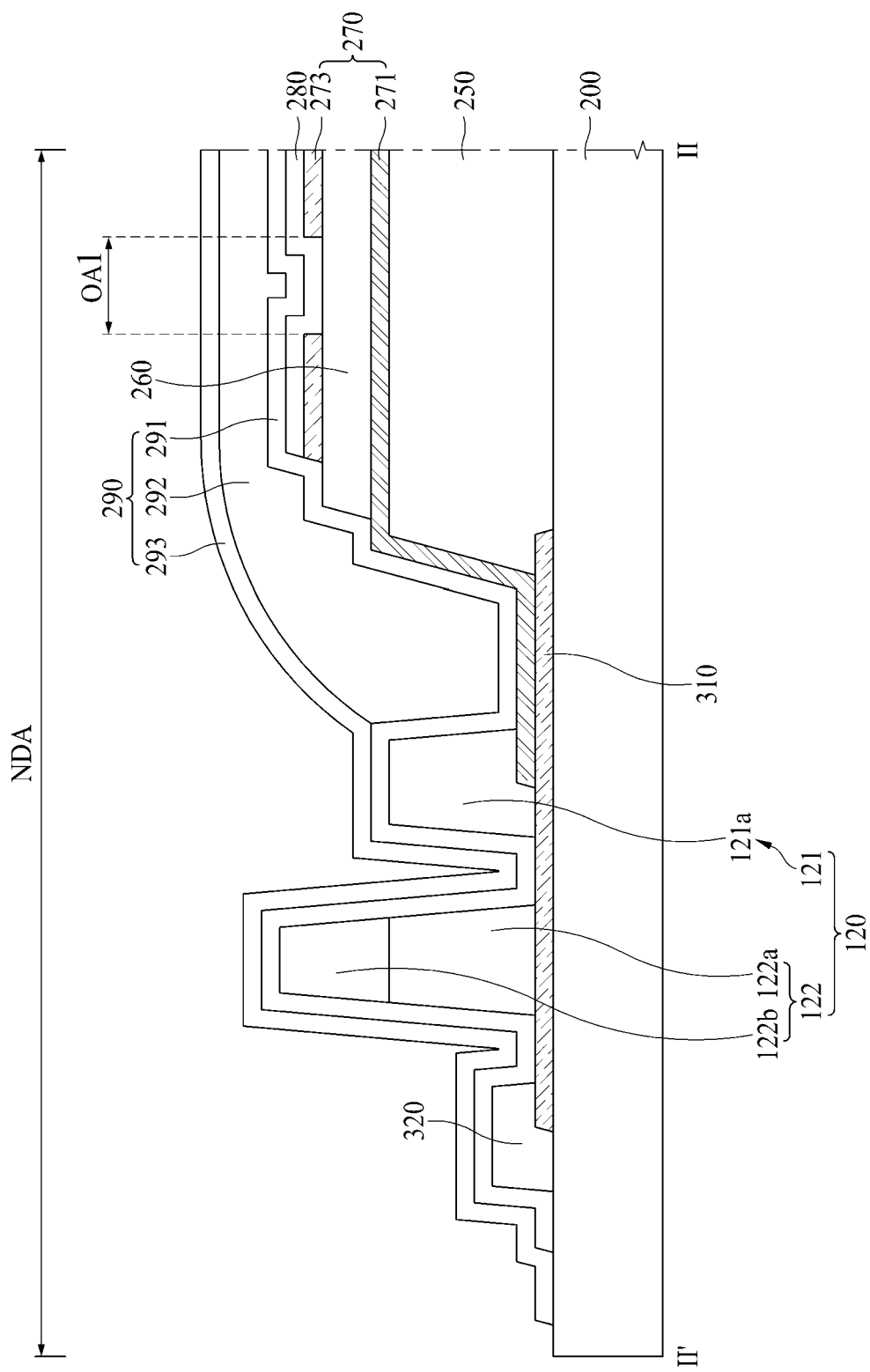
FIG. 5 is a cross-sectional view taken along line II-II' of FIG. 3.
Figure 6:
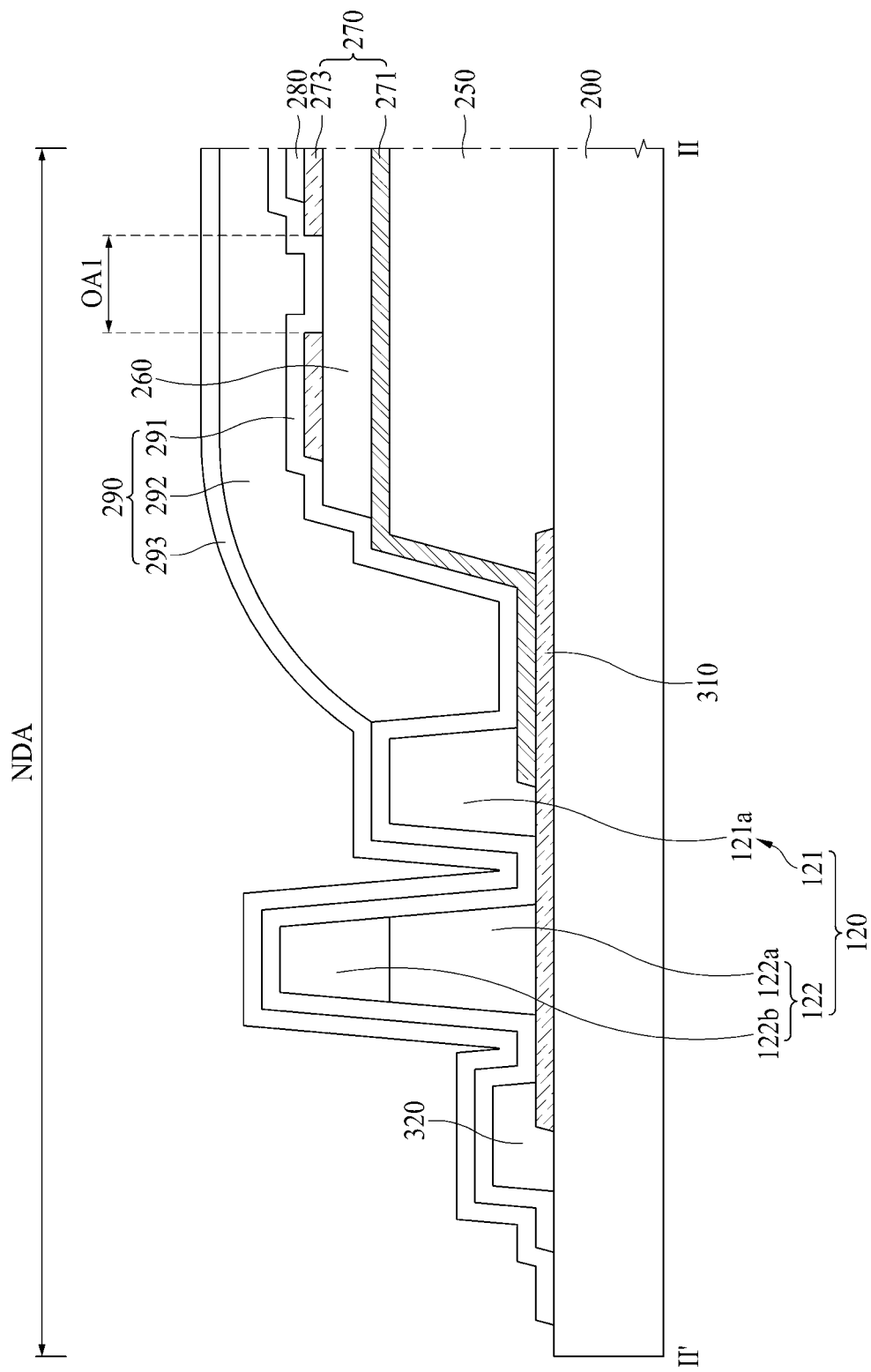
FIG. 6 is a cross-sectional view illustrating a modified embodiment of FIG. 5.
Figure 7:
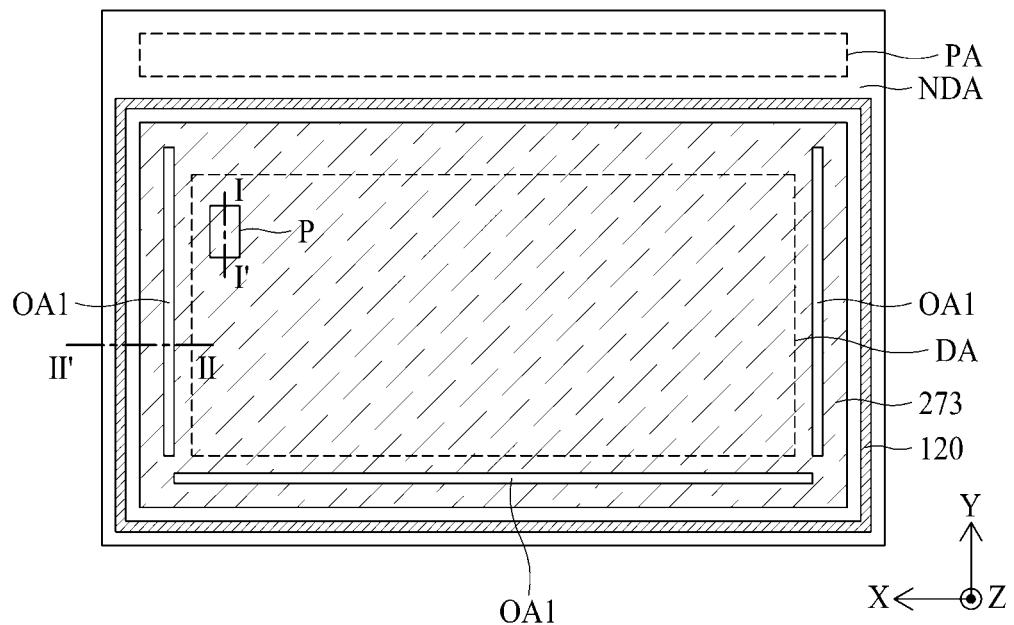
FIG. 7 is a plan view illustrating a modified embodiment of FIG. 3.

FIG. 5 is a cross-sectional view taken along line II-II' of FIG. 3, and FIG. 6 is a cross-sectional view illustrating a modified embodiment of FIG. 5. FIG. 7 is a plan view illustrating a modified embodiment of FIG. 3, and FIG. 8 is a plan view illustrating another modified embodiment of FIG. 3.

Figure 8:
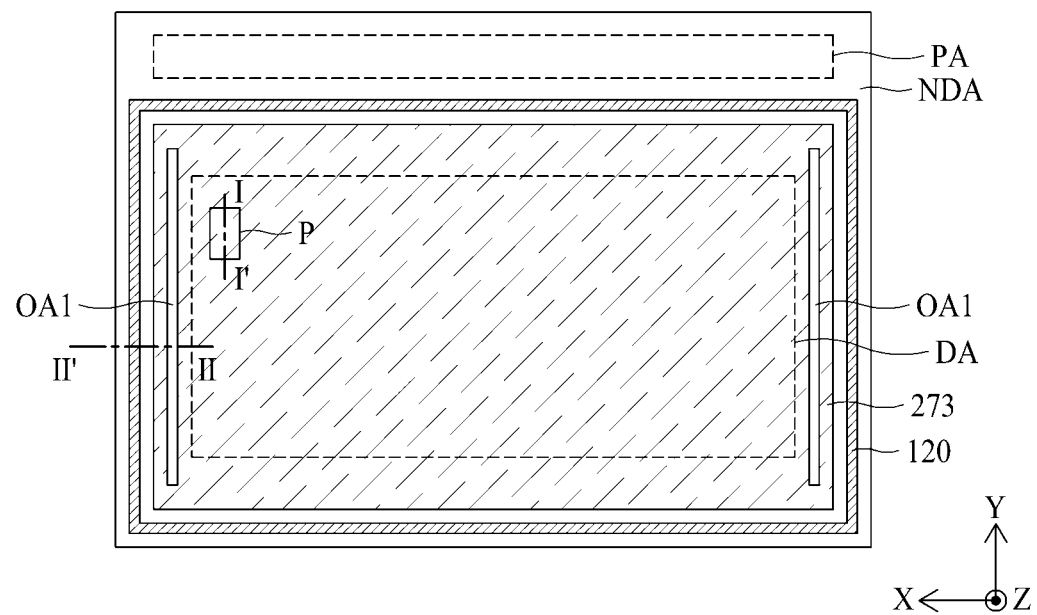
FIG. 8 is a plan view illustrating another modified embodiment of FIG. 3.

FIGS. 7 and 8 illustrate a TFT substrate 200 including TFTs 210 and capacitors 220 whose specific configuration is omitted for the purposes of description. The TFT substrate 200 refers to a substrate in which the TFTs 210 and the capacitors 220 are formed on the first substrate 111.

Referring to FIGS. 3 to 8, a display apparatus according to the first embodiment of the present disclosure includes an organic light emitting element 270, a capping layer 280, an encapsulation layer 290, and a dam (120). Here, the TFT substrate 200 includes a display area DA in which pixels P are formed and a non-display area NDA surrounding the display area DA. The non-display area NDA includes a pad area PA in which a plurality of pads are formed.

The organic light emitting element 270 is disposed in the display area DA. The organic light emitting element 270 includes a second electrode 273, an organic light emitting layer 272, and a first electrode 271. The second electrode 273 may be a cathode electrode, and the first electrode 271 may be an anode electrode. A region where the second electrode 273, the organic light emitting layer 272, and the first electrode 271 are stacked may be defined as a light emitting portion EA.

The first electrode 271 may be formed on the planarization layer 250. The first electrode 271 may extend from the display area DA to a partial region of the non-display area NDA. The first electrode 271 may extend to the dam 120 disposed in the non-display area NDA as illustrated in FIG. 5. The first electrode 271 is connected to the drain electrode 214 of the TFT 210 through the contact hole CH3 penetrating through the passivation layer and the planarization layer 250 in the display area DA in which the pixel P is disposed.

An organic light emitting layer 272 is formed on the first electrode 271. The organic light emitting layer 272 may include a hole transporting layer, at least one light emitting layer, and an electron transporting layer. In this case, when a voltage is applied to the first electrode 271 and the second electrode 273, holes and electrons move to the light emitting layer through the hole transporting layer and the electron transporting layer, respectively, and are combined to emit light.

The second electrode 273 is formed on the organic light emitting layer 272. The second electrode 273 is formed to have an area larger than the display area DA as illustrated in FIGS. 3, 7, and 8. The second electrode 273 may extend from the display area DA to a partial region of the non-display area NDA. However, the second electrode 273 is formed on an inner side of the region where the dam 120 is formed, and is spaced apart from the dam 120.

The second electrode 273 includes at least one first opening area OA1. More specifically, the second electrode 273 may include at least one first opening area OA1 that exposes the bank 260 in the non-display area NDA.

As the second electrode 273 is closer to the edge of the first substrate 111, the second electrode 273 is more likely to be exposed to moisture penetrating through the edge of the first substrate 111. In order to prevent this, the second electrode 273 may need to be away from the edge of the first substrate 111. However, if the area of the second electrode 273 is reduced, another problem in which resistance of the second electrode 273 increases arises. The present disclosure is intended to provide a display apparatus in which moisture does not spread to the second electrode 273 disposed in the display area DA, without significantly reducing the area of the second electrode 273.

In the display apparatus according to the first embodiment of the present disclosure, since the first opening area OA1 is formed in the second electrode 273, the second electrode 273 disposed in the non-display area NDA and the second electrode 273 disposed in the display area DA are partially cut off. Thus, in the display apparatus according to the first embodiment of the present disclosure, moisture, which penetrates to the edge of the second electrode 273, is prevented from being spread to the display area DA. That is, the second electrode 273 disposed in the display area DA may be prevented from being oxidized by moisture.

Meanwhile, the first opening areas OA1 may be formed on at least one of the first side, the second side, the third side, and the fourth side of the first substrate 111.

In an embodiment, the first opening areas OA1 may be formed on the first side, the second side, the third side, and the fourth side of the first substrate 111 as illustrated in FIG. 3. The first opening area OA1 may be disposed between the display area DA and the pad area PA on the first side and may be formed in parallel to the display area DA. Also, the first opening areas OA1 may be disposed outside the display area DA and may be formed to be parallel with the display area DA on the second side, the third side, and the fourth side.

Here, at least one of the first opening areas OA1 formed on the first side, the second side, the third side, and the fourth side may not be connected. That is, some of the first opening areas OA1 formed on the first side, the second side, the third side, and the fourth side may be connected, but at least one of the first opening areas OA1 should not be connected. If all of the first opening areas OA1 formed on the first side, the second side, the third side, and the fourth side are connected, the second electrode 273 disposed in the display area DA and the second electrode 273 disposed in the non-display area NDA may be electrically cut off. The second electrode 273 disposed in the NDA may then be electrically disconnected. Accordingly, even if a voltage is applied to the second electrode 273 disposed in the non-display area NDA, no voltage is applied to the second electrode 273 disposed in the display area DA, and the display apparatus 100 may not operate. Therefore, at least one of the first opening areas OA1 formed on the first side, the second side, the third side, and the fourth side may not be connected.

In another embodiment, the first opening areas OA1 may be formed on the second side, the third side, and the fourth side of the first substrate 111 as illustrated in FIG. 7. The first opening areas OA1 may be disposed outside the display area DA and may be formed to be parallel with the display area DA on the second side, the third side, and the fourth side. Since the pad area PA is formed on the first side, a distance between the edge of the first side and the second electrode 273 is relatively long. Accordingly, since the possibility that moisture penetrating to the first side spreads to the second electrode 273 is low, the first opening area OA1 need not be formed on the first side.

In another embodiment, the first opening areas OA1 may be formed on the third and fourth sides of the first substrate 111 as illustrated in FIG. 8. The first opening areas OA1 may be disposed outside the display area DA and formed to be parallel with the display area DA on the third and fourth sides. In general, a narrow bezel is more important on the left and right bezels than in the upper and lower bezels. As a result, the distance between the edges of the third and fourth sides and the second electrode 273 is shortened and the moisture penetrating from the third and fourth sides is highly likely to be spread to the second electrode 273. In order to prevent the penetrating moisture from being spread to the second electrode 273 disposed in the display area DA, the display apparatus may have the first opening area OA1 on the third and fourth sides of the first substrate 111.

The capping layer 280 is formed on the second electrode 273. The capping layer 280 is formed of at least one of an inorganic material and an organic material. The capping layer 280 may be formed of an inorganic layer, an organic layer, or an organic layer containing inorganic particles.

The capping layer 280 has the same size as the second electrode 273 as illustrated in FIG. 5 to protect the first electrode 271, the organic light emitting layer 272, and the second electrode 273. The capping layer 280 may also be formed on the first opening area OA1 of the second electrode 273.

In FIG. 5, it is illustrated that the capping layer 280 is formed to have the same size as that of the second electrode 273, but the present disclosure is not limited thereto. In another embodiment, the capping layer 280 may be formed to be smaller than the second electrode 273 as illustrated in FIG. 6. The capping layer 280 must be formed in the display area DA to efficiently emit light, which is generated in the organic light emitting layer 272, toward the outside and may not be necessarily formed in the non-display area NDA. The capping layer 280 may be formed on the second electrode 273 disposed in the display area DA and may not be formed in the opening area OA1 and on the second electrode 273 disposed outside the first opening area OA1. Accordingly, the capping layer 280 illustrated in FIG. 6 may prevent moisture penetrating to the edge of the second electrode 273 from being spread to the capping layer 280.

The encapsulation layer 290 covers the organic light emitting element 270 and the capping layer 280 formed in the display area DA to prevent oxygen or moisture from penetrating into the organic light emitting element 270. Here, the encapsulation layer 290 includes at least one inorganic layer and at least one organic layer. For example, the encapsulation layer 290 may include a first inorganic layer 291, an organic layer 292, and a second inorganic layer 293. In this case, the first inorganic layer 291 is formed to cover the first electrode 282. The organic layer 292 is formed on the first inorganic layer 291, and the second inorganic layer 293 is formed to cover the organic layer 292. Here, the second inorganic layer 293 may be formed on the dam 120.

Each of the first and second inorganic layers 291 and 293 may be formed of silicon nitride, aluminum nitride, zirconium nitride, titanium nitride, hafnium nitride, tantalum nitride, silicon oxide, aluminum oxide, or titanium oxide. The first and second inorganic layers 291 and 293 may be deposited by chemical vapor deposition (CVD) or atomic layer deposition (ALD) techniques, but the present disclosure is not limited thereto.

The organic layer 292 may be formed to be transparent to allow light emitted from the organic light emitting layer 272 to pass therethrough. The organic layer 292 may include an organic material allowing 99% or more of light emitted from the organic light emitting layer 272 to pass therethrough, e.g., an acrylic resin, an epoxy resin, a phenolic resin, a polyamide resin, or a polyimide resin. The organic layer 292 may be formed by vapor deposition, printing, or slit coating using an organic material, but the present disclosure is not limited thereto and the organic layer 292 may be formed using an ink-jet process.

The dam 120 is disposed to be spaced apart from the second electrode 273 and the capping layer 280 in the non-display area NDA. The dam 120 is formed to surround the outer periphery of the display area DA to block flow of the organic layer 292 constituting the encapsulation layer 290. The dam 120 is disposed between the display area DA and the pad area PA to block flow of the organic layer 292 such that the organic layer 292 constituting the encapsulation layer 290 is prevented from invading the pad area PA. Thus, the dam 120 may prevent the organic layer 292 from being exposed to the outside of the display apparatus or the organic layer 292 from penetrating the pad area PA.

The dam 120 may include a first dam 121 and a second dam 122. The first dam 121 may be formed to surround the outer periphery of the display area DA to primarily block flow of the organic layer 292 constituting the encapsulation layer 290. Also, the first dam 121 may be disposed between the display area DA and the pad area PA to primarily block flow of the organic layer 292 such that the organic layer 292 may not invade the pad area PA.

The first dam 121 may be spaced apart from a region where the organic light emitting element 280 is formed so that the organic layer 292 may sufficiently cover the organic light emitting element 280 formed on the first substrate 111. Also, the first dam 121 may be spaced apart from the components such as the planarization layer 250 and the bank 260 formed of an organic material which is vulnerable to an ambient environment.

As illustrated in FIG. 5, the first dam 121 may be formed on a power line 310 supplying a power supply voltage to each of the pixels P or on the first electrode 271, the first electrode 271 extending from the display area DA to be in contact with the power line 310. The first dam 121 may include a first lower layer 121a. The first lower layer 121a may be formed on the power line 310 or the first electrode 271.

The first lower layer 121a of the first dam 121 may be formed simultaneously with at least one of the planarization layer 250, the bank 260, and the spacer 265 of the pixel P and may be formed of the same material of at least one of the planarization layer 250, the bank 260, and the spacer 265. For example, the first lower layer 121a of the first dam 121 may be formed of the same material as that of the planarization layer 250 at the same time. In another example, the first lower layer 121a of the first dam 121 may be formed of the same material as that of the bank 260 at the same time. In another example, the first lower layer 121a of the first dam 121 may be formed of the same material as that of the spacer 265 at the same time. In this case, the first lower layer 121a of the first dam 121 may be formed of an organic material such as an acrylic resin, an epoxy resin, a phenolic resin, a polyamide resin, a polyimide resin, or the like.

In FIGS. 5 and 6, it is illustrated that the first dam 121 includes the first lower layer 121a but the present disclosure is not limited thereto. In another embodiment, the first dam 121 may have a two-layer structure including a lower layer and an upper layer. In another embodiment, the first dam 121 may have a three-layer structure including a lower layer, an intermediate layer, and an upper layer.

The second dam 122 may be formed on the outer periphery of the first dam 121 to secondarily block the organic layer 292 overflowing to the outer periphery of the first dam 121. Accordingly, the first dam 121 and the second dam 122 may more effectively block the organic layer 292 from being exposed to the outside of the display apparatus or from invading the pad area PA.

The second dam 122 may be formed on the power line 310 that supplies a power supply voltage to each of the pixels P as illustrated in FIGS. 5 and 6. The second dam 122 may include a second lower layer 122a and a second upper layer 122b. The second lower layer 122a may be formed on the power line 310 and the second upper layer 122b may be formed on the second lower layer 122a.

The second lower layer 122a and the second upper layer 122b of the second dam 122 may be formed simultaneously with at least one of the planarization layer 250, the bank 260, and the spacer 265 of the pixel P and may be formed of the same material as that of at least one of the planarization layer 250, the bank 260, and the spacer 265. For example, the second lower layer 122a of the second dam 122 may be formed of the same material as that of the planarization layer 250 at the same time. The second upper layer 122b of the second dam 122 may be formed of the same material as that of the bank 260 at the same time. In this case, the second lower layer 122a and the second upper layer 122b of the second dam 122 may be formed of an organic material such as an acrylic resin, an epoxy resin, a phenolic resin, a polyamide resin, a polyimide resin, or the like.

In FIGS. 5 and 6, it is illustrated that the second dam 122 includes the second lower layer 122a and the second upper layer 122b. However, the present disclosure is not limited thereto. In another embodiment, the second dam 122 may have a single layer structure as a lower layer. In another embodiment, the second dam 122 may have a three-layer structure including a lower layer, an intermediate layer, and an upper layer.

Meanwhile, in the display apparatus according to the first embodiment of the present disclosure, the passivation layer formed on the TFT 210 and the capacitor 220 may be omitted. In this case, the second inorganic layer 293 constituting the encapsulation layer 290 may be directly formed on the power line 310 formed in the non-display area NDA as illustrated in FIGS. 5 and 6. Here, the second inorganic layer 293 may have a seam due to a stepped portion generated by the power line 310 and moisture may penetrate through the seam. In order to prevent this, the display apparatus according to the embodiment of the present disclosure may further include an organic passivation layer 320.

The organic passivation layer 320 may be spaced apart from the dam 120 in the non-display area NDA to cover the edge of the power line 310. That is, one end of the power line 310 may be covered by the planarization layer 250, and the other end thereof may be covered by the organic passivation layer 320.

The organic passivation layer 320 may be formed simultaneously when at least one of the planarization layer 250, the bank 260, and the spacer 265 of the pixel P is formed, and may be formed of the same material as that of at least one of the planarization layer 250, the bank 260, and spacer 265. For example, the organic passivation layer 320 may be formed of the same material as that of the bank 260 at the same time. In this case, the organic passivation layer 320 may be formed of an organic material such as an acrylic resin, an epoxy resin, a phenolic resin, a polyamide resin, or a polyimide resin.

In FIGS. 5 and 6, it is illustrated that the dam 120 includes the first dam 121 and the second dam 122 but the present disclosure is not limited thereto. In another embodiment, the dam 120 may include only the first dam 121.

Second Embodiment

Figure 9:
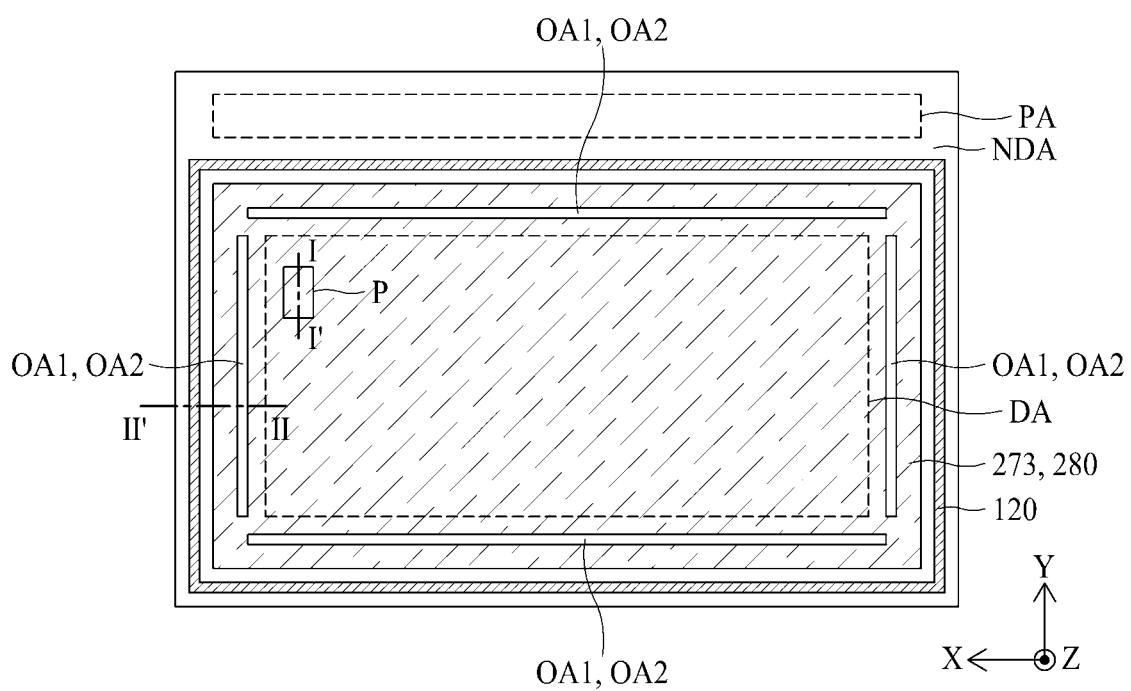
FIG. 9 is a plan view schematically illustrating a first substrate according to a second embodiment of the present disclosure.
Figure 10:
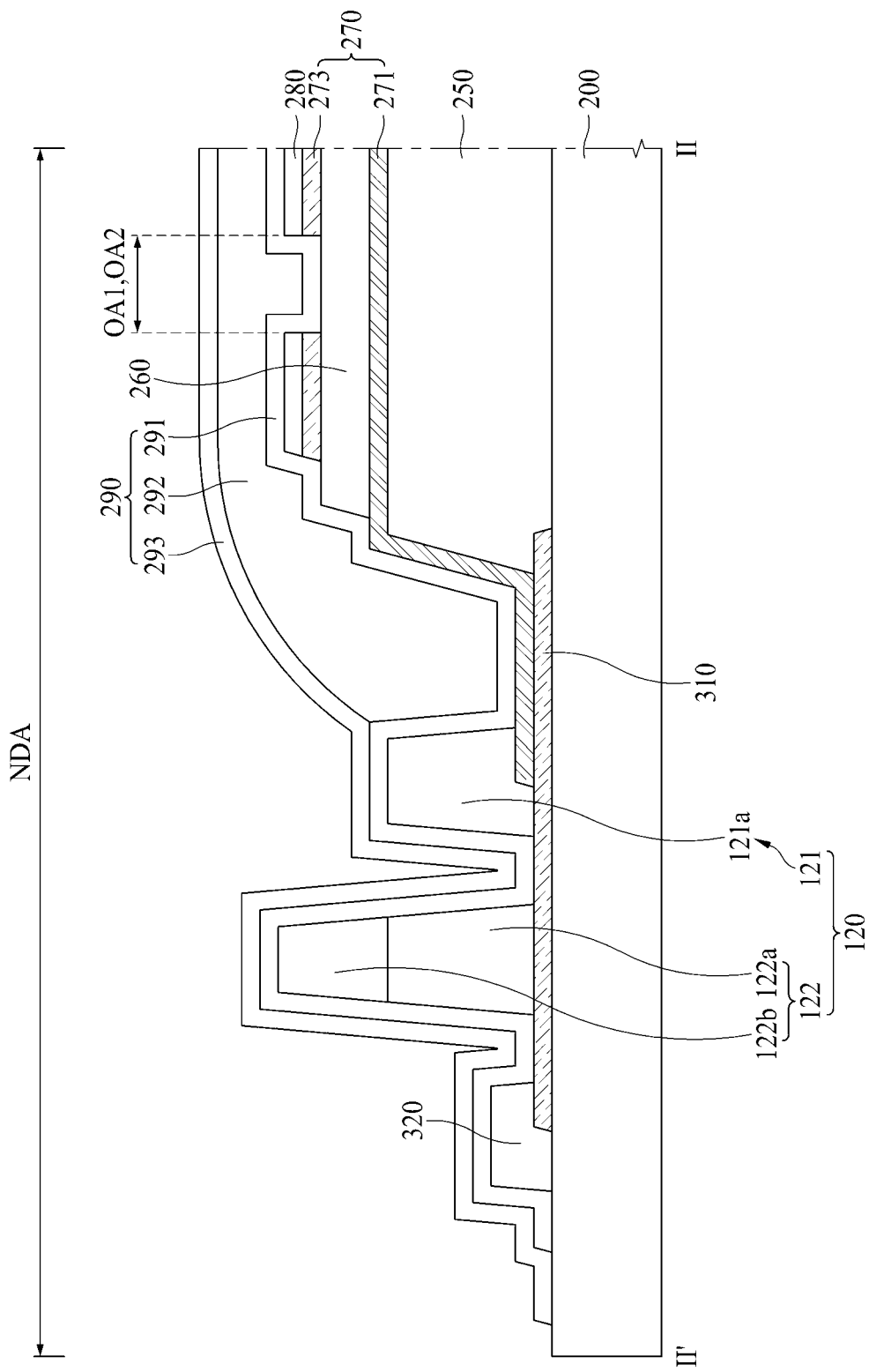
FIG. 10 is a cross-sectional view taken along the line II-II' in FIG. 9.

FIG. 9 is a plan view schematically illustrating a first substrate according to a second embodiment of the present disclosure, and FIG. 10 is a cross-sectional view taken along line II-II' of FIG. 9.

Referring to FIGS. 9 and 10, a display apparatus according to a second embodiment of the present disclosure includes an organic light emitting element 270, a capping layer 280, an encapsulation layer 290, and a dam 120. Since the organic light emitting element 270, the encapsulation layer 290, and the dam 120 are substantially the same as those illustrated in FIGS. 3 to 8, a detailed description thereof will be omitted. Hereinafter, a configuration that differs from the configuration illustrated in FIG. 3 to FIG. 8 will be mainly described.

The TFT substrate 200 includes a display area DA in which pixels P are formed and a non-display area NDA surrounding the display area DA. The non-display area NDA includes a pad area PA in which a plurality of pads are formed.

The organic light emitting element 270 is disposed in the display area DA. The organic light emitting element 270 includes the second electrode 273, the organic light emitting layer 272, and the first electrode 271. The first electrode 271 may be formed on the planarization layer 250 and the organic light emitting layer 272 may be formed on the first electrode 271. The second electrode 273 is formed on the organic light emitting layer 272.

The second electrode 273 has an area larger than the display area DA as illustrated in FIG. 9. The second electrode 273 may extend from the display area DA to a partial region of the non-display area NDA. However, the second electrode 273 is formed on an inner side of a region where the dam 120 is formed, and is spaced apart from the dam 120.

The second electrode 273 includes at least one first opening area OA1. More specifically, the second electrode 273 may include at least one first opening area OA1 that exposes the bank 260 in the non-display area NDA.

As the second electrode 273 is closer to the edge of the first substrate 111, the second electrode 273 is more likely to be exposed to moisture penetrating through the edge of the first substrate 111. In order to prevent this, the second electrode 273 may need to be away from the edge of the first substrate 111. However, if the area of the second electrode 273 is reduced, another problem in which resistance of the second electrode 273 increases arises. The present disclosure is intended to provide a display apparatus in which moisture does not spread to the second electrode 273 disposed in the display area DA, without significantly reducing the area of the second electrode 273.

In the display apparatus according to the second embodiment of the present disclosure, since the first opening area OA1 is formed in the second electrode 273, the second electrode 273 disposed in the non-display area NDA and the second electrode 273 disposed in the display area DA are partially cut off. Thus, in the display apparatus according to the second embodiment of the present disclosure, moisture, which penetrates to the edge of the second electrode 273, is prevented from being spread to the display area DA. That is, the second electrode 273 disposed in the display area DA may be prevented from being oxidized by moisture.

Meanwhile, the first opening areas OA1 may be formed on at least one of the first side, the second side, the third side, and the fourth side of the first substrate 111.

In an embodiment, the first opening areas OA1 may be formed on the first side, the second side, the third side, and the fourth side of the first substrate 111 as illustrated in FIG. 9. The first opening area OA1 may be disposed between the display area DA and the pad area PA on the first side and may be formed in parallel to the display area DA. Also, the first opening areas OA1 may be disposed outside the display area DA and may be formed to be parallel with the display area DA on the second side, the third side, and the fourth side.

Here, at least one of the first opening areas OA1 formed on the first side, the second side, the third side, and the fourth side may not be connected. That is, some of the first opening areas OA1 formed on the first side, the second side, the third side, and the fourth side may be connected, but at least one of the first opening areas OA1 should not be connected.

In another embodiment, the first opening areas OA1 may be formed on the second side, the third side, and the fourth side of the first substrate 111. The first opening areas OA1 may be disposed outside the display area DA and may be formed to be parallel with the display area DA on the second side, the third side, and the fourth side.

In another embodiment, the first opening areas OA 1 may be formed on the third side and the fourth side of the first substrate 111. The first opening areas OA1 may be disposed outside the display area DA and formed on the third and fourth sides in parallel with the display area DA.

In another embodiment, the first opening areas OA1 may be formed on the third and fourth sides of the first substrate 111. The first opening areas OA1 may be disposed outside the display area DA and formed to be parallel with the display area DA on the third and fourth sides.

The capping layer 280 is formed on the second electrode 273. The capping layer 280 is formed of at least one of an inorganic material and an organic material. The capping layer 280 may be formed of an inorganic layer, organic layer, or an organic layer containing inorganic particles.

The capping layer 280 has the same size as the second electrode 273 as illustrated in FIG. 9 to protect the first electrode 271, the organic light emitting layer 272, and the second electrode 273. The capping layer 280 comprises at least one second aperture region OA2. More specifically, the capping layer 280 may include at least one second opening area OA2 that overlaps the entire first opening area OA1 of the second electrode 273 to expose the bank 260.

In the display apparatus according to the second embodiment of the present disclosure, since the second opening area OA2 is formed in the capping layer 280, the capping layer 280 disposed in the non-display area NDA and the capping layer 280 disposed in the display area DA are partially cut off. Thus, in the display apparatus according to the second embodiment of the present disclosure, moisture, which penetrates to the edge of the capping layer 280, is prevented from being spread to the display area DA. That is, spreading of moisture to the second electrode 273 disposed in the display area DA may be prevented through the capping layer 280, thus preventing oxidation of the second electrode 273.

In the display apparatus according to the second embodiment of the present disclosure, the first opening area OA1 of the second electrode 273 and the second opening area OA2 of the capping layer 280 may be formed at the same position and have the same size. The display apparatus according to the second embodiment of the present disclosure does not need to manufacture a separate mask to form the capping layer 280 having the second opening area OA2. That is, since the display apparatus according to the second embodiment of the present disclosure includes the second electrode 273 having the first opening area OA1 and the capping layer 280 having the second opening area OA2 using the same mask, manufacturing cost may be reduced.

Meanwhile, the second opening areas OA2 may be formed on at least one of the first side, the second side, the third side and the fourth side of the first substrate 111.

In an embodiment, the second opening areas OA2 may be formed on the first side, the second side, the third side, and the fourth side of the first substrate 111 as illustrated in FIG. 9. The second opening area OA2 may be disposed between the display area DA and the pad area PA on the first side and may be formed to be parallel with the display area DA. Also, the second opening areas OA2 may be disposed outside the display area DA and may be formed to be parallel with the display area DA on the second side, the third side, and the fourth side.

Here, at least one of the second opening areas OA2 formed on the first side, the second side, the third side, and the fourth side may be connected. Unlike the second electrode 273, the capping layer 280 disposed in the display area DA and the capping layer 280 disposed in the non-display area NDA may not necessarily be connected to each other. Accordingly, all or only some of the second opening areas OA2 formed on the first side, the second side, the third side, and the fourth side may be connected to the capping layer 280 or none of the second opening areas OA2 may be connected to the capping layer 280.

In another embodiment, the second opening areas OA2 may be formed on the second side, the third side, and the fourth side of the first substrate 111, like the first opening area OA1. The second opening areas OA2 may be disposed outside the display area DA and formed to be parallel with the display area DA on the second side, the third side, and the fourth side. Since the pad area PA is formed on the first side, a distance between the edge of the first side and the capping layer 280 is relatively long. Thus, since a possibility that moisture penetrating to the first side is spread to the capping layer 280 is low, the second opening area OA2 needs not to be formed on the first side.

In another embodiment, the second opening areas OA2 may be formed on the third and fourth sides of the first substrate 111, like the first opening area OA1. The second opening areas OA2 may be disposed outside the display area DA and formed to be parallel with the display area DA on the third and fourth sides. In general, the narrow bezel is more important in the left and right bezels than in the upper and lower bezels. Accordingly, a distance between the edges of the third and fourth sides and the capping layer 280 may be reduced and the possibility that moisture penetrating from the third and fourth sides is spread to the capping layer 280 is high. In order to prevent the penetrating moisture from being spread to the capping layer 280 disposed in the display area DA, the display apparatus may have a second opening area OA2 on the third side and the fourth side of the first substrate 111.

Third Embodiment

Figure 11:
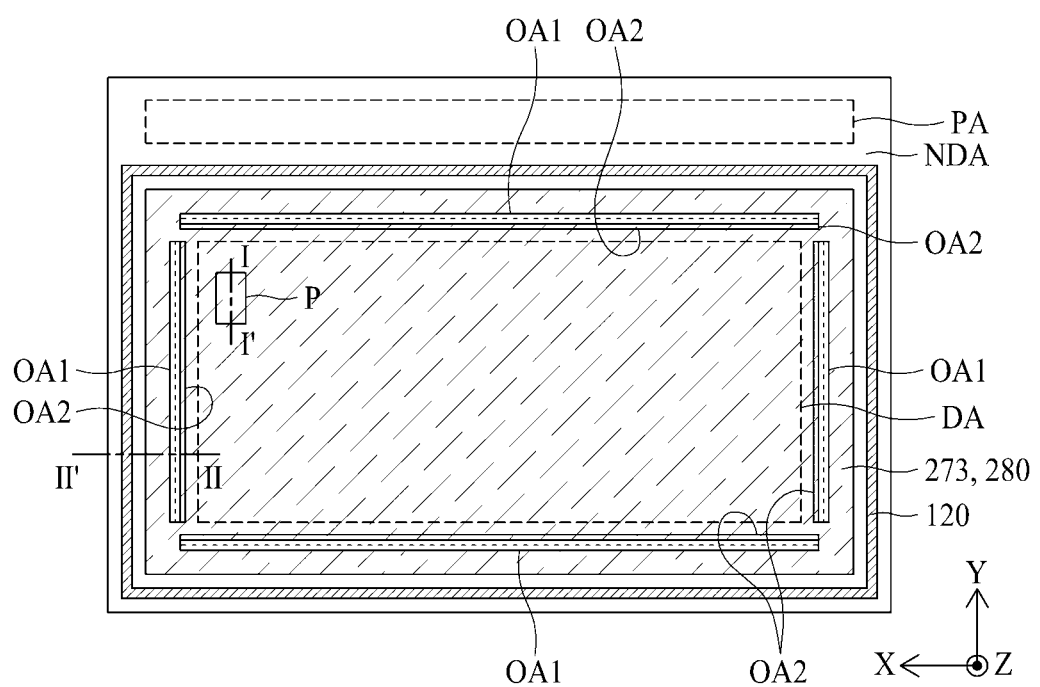
FIG. 11 is a plan view schematically illustrating a first substrate according to a third embodiment of the present disclosure.
Figure 12:
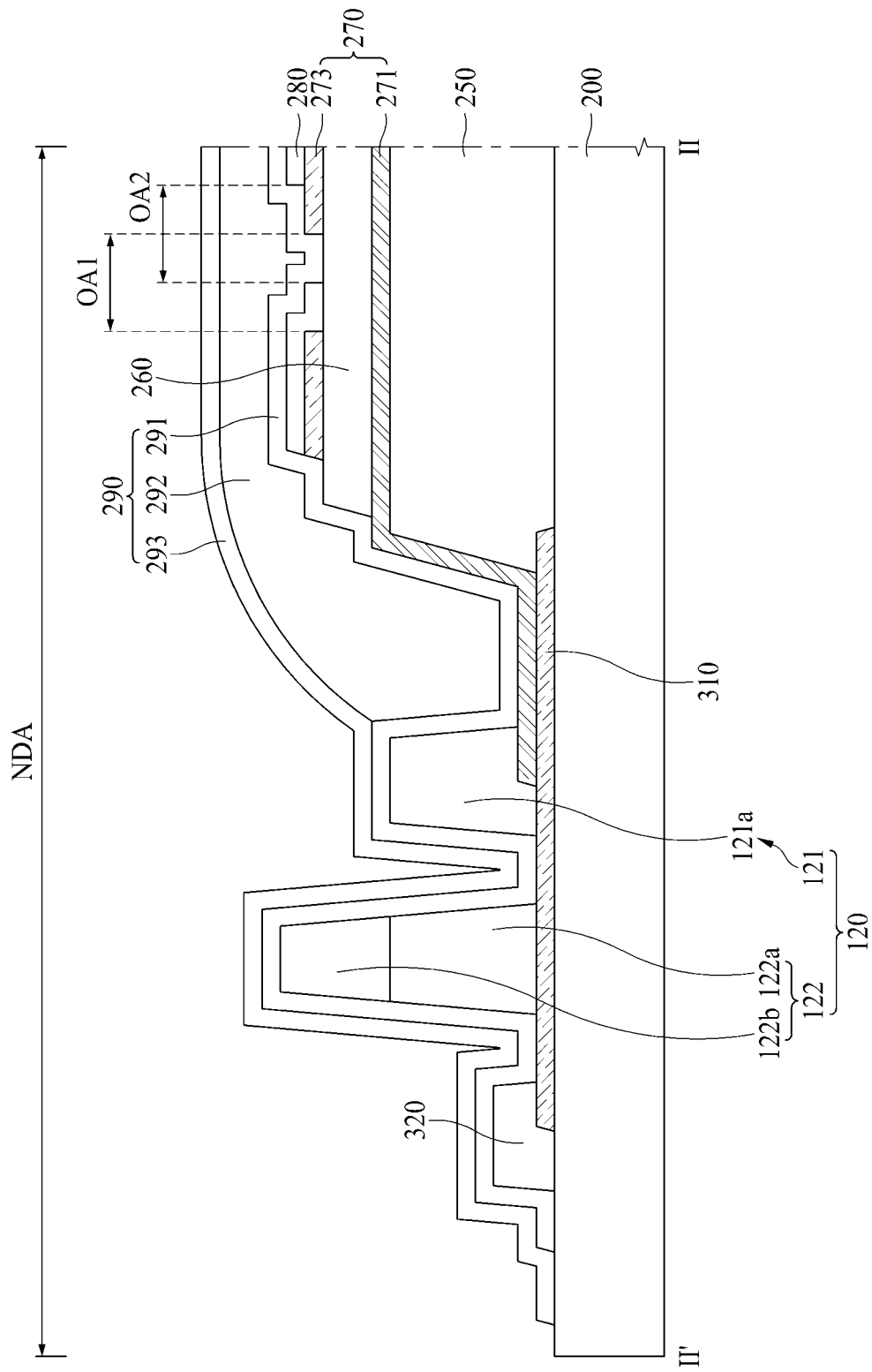
FIG. 12 is a cross-sectional view taken along line II-II' of FIG. 11.

FIG. 11 is a plan view schematically illustrating a first substrate according to a third embodiment of the present disclosure, and FIG. 12 is a cross-sectional view taken along line II-II' of FIG. 11.

Referring to FIGS. 11 and 12, a display apparatus according to a second embodiment of the present disclosure includes an organic light emitting element 270, a capping layer 280, an encapsulation layer 290, and a dam 120. Since the organic light emitting element 270, the encapsulation layer 290, and the dam 120 are substantially the same as those illustrated in FIGS. 3 to 8, a detailed description thereof will be omitted. Hereinafter, a configuration that differs from the configuration illustrated in FIG. 3 to FIG. 8 will be mainly described.

The TFT substrate 200 includes a display area DA in which pixels P are formed and a non-display area NDA surrounding the display area DA. The non-display area NDA includes a pad area PA in which a plurality of pads are formed.

The organic light emitting element 270 is disposed in the display area DA. The organic light emitting element 270 includes the second electrode 273, the organic light emitting layer 272, and the first electrode 271. The first electrode 271 may be formed on the planarization layer 250 and the organic light emitting layer 272 may be formed on the first electrode 271. The second electrode 273 is formed on the organic light emitting layer 272.

The second electrode 273 has an area larger than the display area DA as illustrated in FIG. 11. The second electrode 273 may extend from the display area DA to a partial region of the non-display area NDA. However, the second electrode 273 is formed on an inner side of a region where the dam 120 is formed, and is spaced apart from the dam 120.

The second electrode 273 includes at least one first opening area OA1. More specifically, the second electrode 273 may include at least one first opening area OA1 that exposes the bank 260 in the non-display area NDA.

As the second electrode 273 is closer to the edge of the first substrate 111, the second electrode 273 is more likely to be exposed to moisture penetrating through the edge of the first substrate 111. In order to prevent this, the second electrode 273 may need to be away from the edge of the first substrate 111. However, if the area of the second electrode 273 is reduced, another problem in which resistance of the second electrode 273 increases arises. The present disclosure is intended to provide a display apparatus in which moisture does not spread to the second electrode 273 disposed in the display area DA, without significantly reducing the area of the second electrode 273.

In the display apparatus according to the third embodiment of the present disclosure, since the first opening area OA1 is formed in the second electrode 273, the second electrode 273 disposed in the non-display area NDA and the second electrode 273 disposed in the display area DA are partially cut off. Thus, in the display apparatus according to the third embodiment of the present disclosure, moisture, which penetrates to the edge of the second electrode 273, is prevented from being spread to the display area DA. That is, the second electrode 273 disposed in the display area DA may be prevented from being oxidized by moisture.

Meanwhile, the first opening areas OA1 may be formed on at least one of the first side, the second side, the third side, and the fourth side of the first substrate 111.

In an embodiment, the first opening areas OA1 may be formed on the first side, the second side, the third side, and the fourth side of the first substrate 111 as illustrated in FIG. 11. The first opening area OA1 may be disposed between the display area DA and the pad area PA on the first side and may be formed in parallel to the display area DA. Also, the first opening areas OA1 may be disposed outside the display area DA and may be formed to be parallel with the display area DA on the second side, the third side, and the fourth side.

Here, at least one of the first opening areas OA1 formed on the first side, the second side, the third side, and the fourth side may not be connected. That is, some of the first opening areas OA1 formed on the first side, the second side, the third side, and the fourth side may be connected, but at least one of the first opening areas OA1 should not be connected.

In another embodiment, the first opening areas OA1 may be formed on the second side, the third side, and the fourth side of the first substrate 111. The first opening areas OA1 may be disposed outside the display area DA and may be formed to be parallel with the display area DA on the second side, the third side, and the fourth side.

In another embodiment, the first opening areas OA 1 may be formed on the third side and the fourth side of the first substrate 111. The first opening areas OA1 may be disposed outside the display area DA and formed on the third and fourth sides in parallel with the display area DA.

In another embodiment, the first opening areas OA1 may be formed on the third and fourth sides of the first substrate 111. The first opening areas OA1 may be disposed outside the display area DA and formed to be parallel with the display area DA on the third and fourth sides.

The capping layer 280 is formed on the second electrode 273. The capping layer 280 is formed of at least one of an inorganic material and an organic material. The capping layer 280 may be formed of an inorganic layer, organic layer, or an organic layer containing inorganic particles.

The capping layer 280 has the same size as the second electrode 273 as illustrated in FIG. 11 to protect the first electrode 271, the organic light emitting layer 272, and the second electrode 273. The capping layer 280 comprises at least one second aperture region OA2 (e.g., an opening area). More specifically, the capping layer 280 may include at least one second opening area OA2 that overlaps a portion of first opening area OA1 of the second electrode 273 to expose the bank 260.

In the display apparatus according to the third embodiment of the present disclosure, the first opening area OA1 of the second electrode 273 and the second opening area OA2 of the capping layer 280 may partially overlap each other. The second opening area OA2 of the capping layer 280 need not be formed at the same position and have the same size as that of the first opening area OA1 of the second electrode 273 as in the second embodiment of the present disclosure. That is, the second opening area OA2 of the capping layer 280 may be formed at a different position and have a size different from that of the first opening area OA1 of the second electrode 273. In this case, however, the second opening area OA2 of the capping layer 280 may partially overlap the first opening area OA1 of the second electrode 273. That is, a region where both the capping layer 280 and the second electrode 273 are not formed must exist. Through this, although moisture penetrates to the edge of the capping layer 280, moistures may be prevented from being spread to the second electrode 273 disposed in the display area EA through the capping layer 280.

In the display apparatus according to the third embodiment of the present disclosure, since the second opening area OA2 is formed in the capping layer 280, the capping layer 280 disposed in the non-display area NDA and the capping layer 280 disposed in the display area DA are partially cut off. Thus, in the display apparatus according to the third embodiment of the present disclosure, moisture, which penetrates to the edge of the capping layer 280, is prevented from being spread to the display area DA. That is, spreading of moisture to the second electrode 273 disposed in the display area DA may be prevented through the capping layer 280, thus preventing oxidation of the second electrode 273.

Meanwhile, the second opening areas OA2 may be formed on at least one of the first side, the second side, the third side and the fourth side of the first substrate 111.

In an embodiment, the second opening areas OA2 may be formed on the first side, the second side, the third side, and the fourth side of the first substrate 111 as illustrated in FIG. 11. The second opening area OA2 may be disposed between the display area DA and the pad area PA on the first side and may be formed to be parallel with the display area DA. Also, the second opening areas OA2 may be disposed outside the display area DA and may be formed to be parallel with the display area DA on the second side, the third side, and the fourth side.

Here, at least one of the second opening areas OA2 formed on the first side, the second side, the third side, and the fourth side may be connected. Unlike the second electrode 273, the capping layer 280 disposed in the display area DA and the capping layer 280 disposed in the non-display area NDA may not necessarily be connected to each other. Accordingly, all or only some of the second opening areas OA2 formed on the first side, the second side, the third side, and the fourth side may be connected, or none of the second opening areas OA2 may be connected.

In another embodiment, the second opening areas OA2 may be formed on the second side, the third side, and the fourth side of the first substrate 111, like the first opening area OA1. The second opening areas OA2 may be disposed outside the display area DA and formed to be parallel with the display area DA on the second side, the third side, and the fourth side. Since the pad area PA is formed on the first side, a distance between the edge of the first side and the capping layer 280 is relatively long. Thus, since a possibility that moisture penetrating to the first side is spread to the capping layer 280 is low, the second opening area OA2 needs not to be formed on the first side.

In another embodiment, the second opening areas OA2 may be formed on the third and fourth sides of the first substrate 111, like the first opening area OA1. The second opening areas OA2 may be disposed outside the display area DA and formed to be parallel with the display area DA on the third and fourth sides. In general, the narrow bezel is more important in the left and right bezels than in the upper and lower bezels. Accordingly, a distance between the edges of the third and fourth sides and the capping layer 280 may be reduced and the possibility that moisture penetrating from the third and fourth sides is spread to the capping layer 280 is high. In order to prevent the penetrating moisture from being spread to the capping layer 280 disposed in the display area DA, the display apparatus may have a second opening area OA2 on the third side and the fourth side of the first substrate 111.

According to the present disclosure, since the first opening area is formed in the second electrode, the second electrode disposed in the non-display area and the second electrode disposed in the display area may be partially cut off. Thus, according to the present disclosure, it is possible to prevent moisture, which has penetrated to the edge of the second electrode, from being spread to the display area, without significantly reducing a formation area of the second electrode. That is, it is possible to prevent the second electrode disposed in the display area from being oxidized by moisture.

Further, although the width of the bezel is reduced, moisture which has penetrated into the edge of the second electrode is not spread to the display area due to the first opening area. Accordingly, the present disclosure may implement a narrow bezel.

Further, in the present disclosure, since the second opening area is formed in the capping layer, the capping layer disposed in the non-display area and the capping layer disposed in the display area may be partially cut off. Accordingly, the present disclosure may prevent moisture, which has penetrated into the edge of the capping layer, from being spread to the display area. Also, it is possible to prevent moisture from being spread to the second electrode disposed in the display area through the capping layer, thereby preventing the second electrode from being oxidized.

In addition, in the present disclosure, the first opening area of the second electrode and the second opening area of the capping layer may be formed at the same position and have the same size. In the present disclosure, there is no need to manufacture a separate mask to form the capping layer having the second opening area. Thus, in the present disclosure, since the second electrode having the first opening area and the capping layer having the second opening area are formed using the same mask, manufacturing cost may be reduced.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate comprising a display area where light is emitted and a non-display area where no light is emitted, the non-display area surrounding the display area;
   a first electrode on the substrate;
   an organic light emitting layer on the first electrode; and
   a second electrode in both the display area and the non-display area of the substrate on the organic light emitting layer, the second electrode comprising at least one opening area in the non-display area of the substrate, the second electrode disposed in the display area and the second electrode disposed in the non-display area being partially cut off by the opening area.

2. The display apparatus of claim 1, wherein the at least one opening area of the second electrode comprises a first opening area and a second opening area in the non-display area of the substrate, wherein the first opening area and the second opening area are not connected to each other.

3. The display apparatus of claim 1, further comprising:
   a dam in the non-display area, the dam horizontally spaced apart from the second electrode.

4. The display apparatus of claim 3, wherein the at least one opening area of the second electrode is formed between the dam and the display area.

5. The display apparatus of claim 1, wherein
   the substrate comprises a first side on which a plurality of pads are formed, a second side facing the first side, a third side connecting a first end of the first side and a first end of the second side, and a fourth side connecting a second end of the first side and a second end of the second side, the at least one opening area of the second electrode is parallel with the third side and the fourth side of the substrate.

6. The display apparatus of claim 5, wherein the at least one opening area of the second electrode is parallel with the second side of the substrate.

7. The display apparatus of claim 6, wherein the at least one opening area of the second electrode is further formed to be parallel with the first side of the substrate.

8. The display apparatus of claim 7, wherein the at least one opening area of the second electrode includes a plurality of opening areas, the plurality of opening areas not connected to each other.

9. The display apparatus of claim 1, further comprising:
a capping layer on the second electrode, the capping layer comprising at least one opening area.

10. The display apparatus of claim 9, wherein the at least one opening area of the capping layer is in the non-display area.

11. The display apparatus of claim 9, wherein the at least one opening area of the capping layer partially overlaps the at least one opening area of the second electrode.

12. The display apparatus of claim 9, wherein the at least one opening area of the capping layer entirely overlaps the at least one opening area of the second electrode.

13. The display apparatus of claim 9, wherein the capping layer is a same size as the second electrode.

14. The display apparatus of claim 1, further comprising a capping layer formed on the second electrode.

15. The display apparatus of claim 14, wherein the capping layer has a smaller area than the second electrode.

16. The display apparatus of claim 9, wherein the at least one opening area of the capping layer comprises a plurality of opening areas that are all connected to each other.

17. A display apparatus comprising:
a substrate comprising a display area where light is emitted and a non-display area where light is not emitted;
a first electrode in the display area of the substrate;
an organic light emitting layer overlapping the first electrode in the display area of the substrate;
a second electrode in both the display area and the non-display area of the substrate and overlapping the organic light emitting layer in the display area, the second electrode including a first opening area and a second opening area, the second electrode disposed in the display area and the second electrode disposed in the non-display area being partially cut off by the first opening area and the second opening area,
wherein the first opening area is in a first portion of the second electrode that is in the non-display area of the substrate, and wherein the second opening area is parallel to the first opening area and is in a second portion of the second electrode that is in the non-display area of the substrate.

18. The display apparatus of claim 17, wherein the second electrode further comprises:
a third opening area in a third portion of the second electrode that is in the non-display area of the substrate, wherein the first opening area is perpendicular to the first opening area, and
a fourth opening area in a fourth portion of the second electrode that is in the non-display are of the substrate, wherein the fourth opening area is parallel to the third opening area.

19. The display apparatus of claim 18, wherein the first opening area, the second opening area, the third opening area, and the fourth opening area are not connected together.

20. The display apparatus of claim 17, further comprising:
a capping layer covering the second electrode.

21. The display apparatus of claim 20, wherein the capping layer completely overlaps the second electrode.

22. The display apparatus of claim 21, wherein the capping layer has an area smaller than the area of the second electrode.

23. The display apparatus of claim 18, further comprising:
a capping layer on the second electrode, the capping layer comprising:
a first opening area of the capping layer that completely overlaps the first opening area of the second electrode,
a second opening area of the capping layer that completely overlaps the second opening area of the second electrode,
a third opening area of the capping layer that completely overlaps the third opening area of the second electrode, and
a fourth opening area of the capping layer that completely overlaps the fourth opening area of the second electrode.

24. The display apparatus of claim 18, further comprising:
a capping layer on the second electrode, the capping layer comprising:
a first opening area of the capping layer that partially overlaps the first opening area of the second electrode, and
a second opening area of the capping layer that partially overlaps the second opening area of the second electrode,
a third opening area of the capping layer that partially overlaps the third opening area of the second electrode, and
a fourth opening area of the capping layer that partially overlaps the fourth opening area of the second electrode.

* * * * *